(12) United States Patent
Huang

(10) Patent No.: US 11,035,902 B2
(45) Date of Patent: Jun. 15, 2021

(54) ADVANCED FUEL GAUGE

(71) Applicant: Integrated Device Technology, Inc., San Jose, CA (US)

(72) Inventor: Eric Huang, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 323 days.

(21) Appl. No.: 16/156,445

(22) Filed: Oct. 10, 2018

(65) Prior Publication Data

US 2019/0107581 A1    Apr. 11, 2019

Related U.S. Application Data

(60) Provisional application No. 62/570,572, filed on Oct. 10, 2017.

(51) Int. Cl.
*G01R 31/367* (2019.01)
*G01R 31/389* (2019.01)
*G01R 31/3842* (2019.01)

(52) U.S. Cl.
CPC ......... *G01R 31/367* (2019.01); *G01R 31/389* (2019.01); *G01R 31/3842* (2019.01)

(58) Field of Classification Search
CPC .............................. G01R 31/367; G01R 31/389
USPC .......................................................... 702/63
See application file for complete search history.

(56) References Cited

U.S. PATENT DOCUMENTS

| | | | | |
|---|---|---|---|---|
| 2010/0090651 A1* | 4/2010 | Sahu | ....................... | H01M 8/20 320/132 |
| 2011/0172939 A1* | 7/2011 | Uprety | ................. | G01R 31/392 702/63 |
| 2012/0310568 A1* | 12/2012 | Wang | ................. | G01R 31/3842 702/63 |
| 2013/0158916 A1* | 6/2013 | Baruzzi | ................ | G01R 31/367 702/63 |
| 2013/0297243 A1* | 11/2013 | Baba | ................... | H02J 7/00716 702/63 |
| 2014/0244193 A1* | 8/2014 | Balasingam | ....... | G01R 31/3835 702/63 |
| 2015/0032394 A1* | 1/2015 | Kimura | ................ | G01R 31/367 702/63 |
| 2015/0064510 A1* | 3/2015 | Wang | .................... | H01M 10/63 429/50 |
| 2015/0088443 A1* | 3/2015 | Lorin | .................... | G01R 31/367 702/63 |
| 2016/0003913 A1* | 1/2016 | Zhu | ....................... | G01R 31/367 702/63 |

* cited by examiner

*Primary Examiner* — Ricky Ngon
(74) *Attorney, Agent, or Firm* — Haynes and Boone, LLP

(57) ABSTRACT

In accordance with aspects of the present invention, a method of providing a fuel gauge is provided. The method includes measuring a battery current through and a battery voltage across a battery; determining an equivalent resistance from the current and the voltage using a multiplier K; determining an open circuit voltage based, in part, on the equivalent resistance; determining a state-of-charge based on the open circuit voltage; and adjusting the multiplier K based on the current and the state-of-charge.

8 Claims, 2 Drawing Sheets

ADVANCED FUEL GAUGE

RELATED APPLICATIONS

The present disclosure claims priority to U.S. Provisional Application 62/570,572, entitled "Advanced Fuel Gauge," filed on Oct. 10, 2017, which is herein incorporated by reference in its entirety.

TECHNICAL FIELD

Embodiments of the present invention are related to battery management technology and, specifically, to an advanced fuel gauge.

DISCUSSION OF RELATED ART

Mobile devices, for example smart phones, tablets, wearable devices and other devices are increasingly dependent on battery systems for functionality. Monitoring and maintenance of these battery systems becomes increasingly more important as the dependencies on these devices increases. These monitoring processes include monitoring battery charge, battery temperature, and other parameters during use, charging, and determination of the quality of the battery system. In many such systems, battery characterization is a large component of the battery management process.

Traditionally, battery characterization is conducted to determine the optimized equivalent resistance (Req), which is an input to the voltage fuel gauge algorithm to calculate battery Open Circuit Voltage (OCV), at characterized temperatures based on the battery's dynamic response. Simulation is then used to determine the optimized Equivalent Resistance (Req) at each characterized temperature. The resistance Req across temperature is calculated from piece-wise linear or an exponential function of temperature.

However, there are various problems with this approach. Actual battery equivalent resistance is a function of battery remaining capacity under the same battery temperature. Further, actual battery equivalent resistance is a function of load current under the same battery temperature. Battery to battery variation causes error between characterized battery versus actual battery characteristics. This difference causes large OCV error, especially at cold temperatures. The resistance Req calculated using a piece-wise linear function creates additional error at non-characterized temperatures.

Further, this open loop implementation does not take into effect battery aging. As the battery ages, the equivalent resistance often increases across all temperatures. However, such adjustments to the equivalent resistance with battery age is often not considered during the equivalent resistance calculations.

Therefore, there is a need to develop better characterization techniques for battery management systems.

SUMMARY

In accordance with aspects of the present invention, a method of providing a fuel gauge is provided. The method includes measuring a battery current through and a battery voltage across a battery; determining an equivalent resistance from the current and the voltage using a multiplier K; determining an open circuit voltage based, in part, on the equivalent resistance; determining a state-of-charge based on the open circuit voltage; and adjusting the multiplier K based on the current and the state-of-charge.

A fuel gauge according to some embodiments includes a voltage analog-to-digital converter coupled to a battery and configured to provide a battery voltage; a current analog-to-digital converter coupled to the battery and configured to provide a battery current; a divider coupled to receive the battery voltage and the battery current and configured to produce a resistance; a multiplier coupled to produce an equivalent resistance by multiplying the resistance by a multiplier value K; an adaptive loop that produces the multiplier value K; a table lookup coupled to provide a capacitance based on an open-circuit voltage; a summer that takes a difference between the battery voltage and the open-circuit voltage; and an engine that produces a new open-circuit voltage based on the open-circuit voltage, the capacitance, and the difference.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
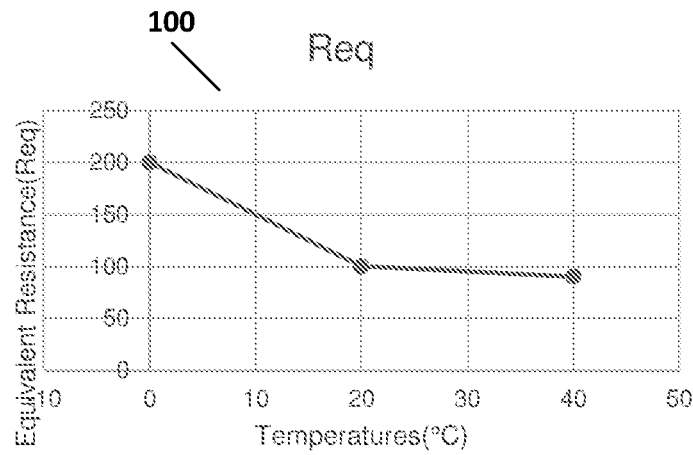
FIG. 1 illustrates an example of an optimized equivalent resistance versus temperature for some batteries.

Traditionally, battery characterization was conducted to determine the optimized equivalent resistance ($R_{eq}$) at characterized temperatures based on a battery's dynamic response. FIG. 1 illustrates an example graph 100 of $R_{eq}$ versus temperature that may be used in a conventional calculation of $R_{eq}$. The battery has been characterized at 3 temperatures (0° C., 20° C., and 40° C. in FIG. 1). A simulation can be used to determine the optimized $R_{eq}$ at each characterized temperature. The value of $R_{eq}$ across the temperature range can be calculated from a piece-wise linear or an exponential function of temperature based on the data provided in FIG. 1.

As discussed above, such an approach to this method of determining the equivalent resistance has several difficulties. The actual battery resistance is a function of battery remaining capacity under the same battery temperature. The actual battery resistance is also a function of load current at the same battery temperature. Further, variation between batteries causes errors between the characterized battery and performance of any individual actual battery. These differences can cause large open circuit voltage (OCV) errors, especially at cold temperatures. Further, calculating the equivalent resistance using a piece-wise linear function creates additional error at non-characterized temperatures, especially temperatures outside of the range where data is actually acquired. An additional error comes from failing to account for the effects of battery aging in these open-loop implementations. As discussed above, as the battery ages, the equivalent resistance of the battery increases across all temperatures.

Figure 2:
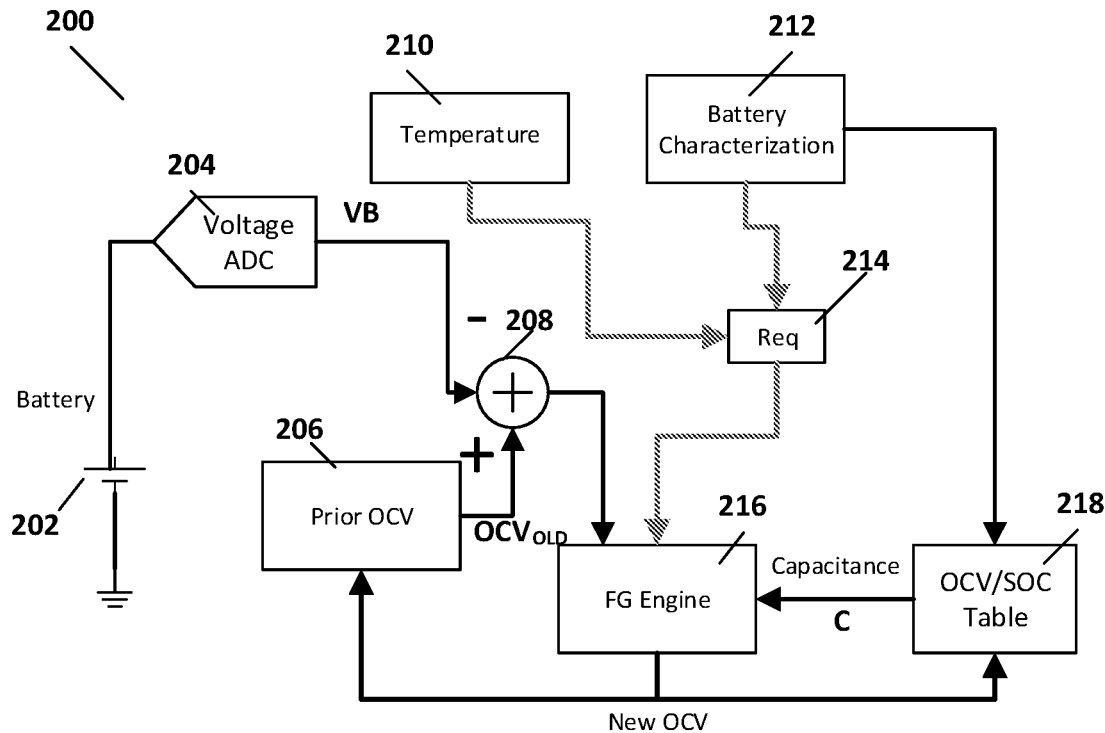
FIG. 2 illustrates a conventional system for calculating open-circuit voltage (OCV).

FIG. 2 illustrates a diagram 200 of a conventional calculation of OCV of a battery 202 using a conventional calculation of $R_{eq}$ as described above. In diagram 200, the calculation of $R_{eq}$ is performed in REQ 214, which receives a measured temperature T from temperature block 210 and battery characterization data for battery 202 from battery characterization block 212. As discussed above, the value of $R_{eq}$ can be calculated according to the temperature curves as illustrated in FIG. 1 above. Battery characterization data from battery characterization block 212 can include the data illustrated in FIG. 1. As discussed above, the value Req calculated in block 214 can be calculated from a linear or exponential function of temperature based on the characterization data. As discussed above, a piecewise-linear or exponential fitting of the characterization data of battery 202 stored in battery characterization 212 can provide the value of $R_{eq}$ determined by REQ 214.

Also illustrated in FIG. 2, engine 216 also receives a capacitance C from block 218. Block 218 receives an OCV output that is generated by engine block 216 and, based on battery characterization from characterization block 212, provides a state-of-charge (SOC) and an equivalent capacitance of battery 202 based on the value of the OCV output from engine 216.

As is further illustrated, the voltage of the battery is sampled by an analog-to-digital converter (ADC) 204 to provide a digitized voltage $V_B$ representing the voltage output of battery 202. The previous calculation of the OCV from engine 216, $OCV_{OLD}$ is stored in block 206. In summer 208, the difference between the stored value $OCV_{OLD}$ and battery voltage $V_B$ ($OCV_{OLD}-V_B$) is also input into engine 216.

Consequently, as is illustrated in FIG. 2, engine 216 receives the value of the equivalent resistance $R_{eq}$ from REQ block 214, the capacitance C from block 218, and the voltage difference ($OCV_{OLD}-V_B$) from summer 208 and produces an updated OCV, $OCV_{new}$. Engine 216 may produce the new OCV according to the following formula:

$$OCV_{new} = OCV_{old} + (V_B - OCV_{old}) * \left(1 - e^{\left(\frac{-t}{R_{eq}*C}\right)}\right),$$

where t is the time measured from the age of the current value of OCV produced by engine 216.

As discussed above, there are a number of problems with the conventional approach as illustrated in FIGS. 1 and 2 and discussed above. In particular, actual battery resistance is not a function of temperature along, but is also a function of remaining battery capacity, load current, and battery age. Further, there are significant differences between batteries. These differences and other factors can cause large open-circuit voltage (OCV) error, especially at colder temperatures. Additionally, the value $R_{eq}$ calculated using a piece-wise linear function creates additional error, especially for temperatures that lie outside of the range that has been specifically characterized.

Figure 3:
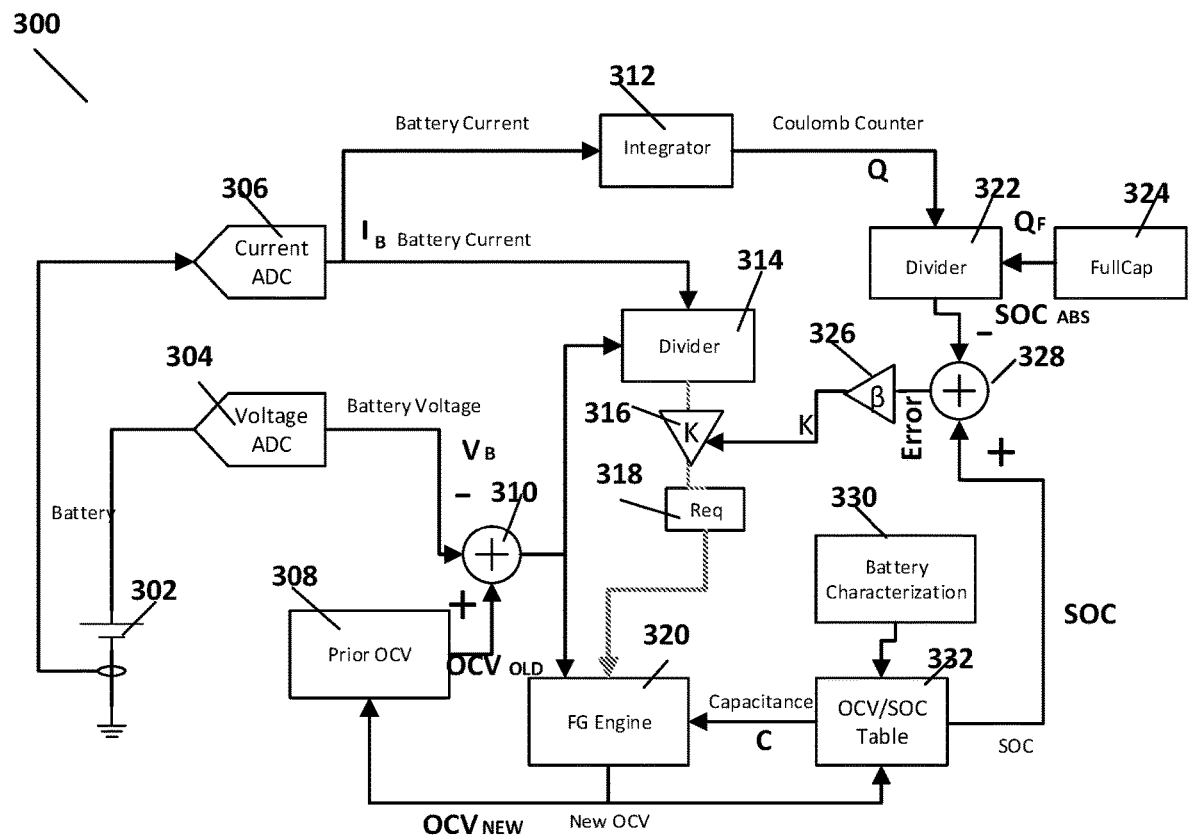
FIG. 3 illustrates a calculation of OCV based on a calculation of $R_{eq}$ according to some embodiments of the present invention.

FIG. 3 illustrates a calculation of the OCV of battery 302 according to embodiments of the present invention. As is illustrated in FIG. 3, the battery current from battery 302 is measured as well as the voltage across battery 302. Measuring battery current allows a much more accurate way to calculate the equivalent resistance across temperature, load, and aging conditions for battery 302.

There are several advantages to this approach. For example, the calculated open-circuit-voltage (OCV) and state-of-charge (SOC) using this method is much more accurate across temperature, load, SOC % level, and battery age conditions. Further, the resulting fuel gauge no longer uses temperature information to determine OCV and SOC, which eliminates the need for battery characterization if the battery chemistry is known. The OCV/SOC table is based on the battery chemistry rather than characterization of the battery. Further, since the absolute full capacity (AbsFullCap) is related to the ratio of the change in charge to the change in the state of charge ($\Delta Q/\Delta SOC$), having a more accurate OCV and SOC determination will result in a more accurate tracking of the battery's full capacity. As a result, embodiments of the present invention result in the first non-temperature dependent fuel gauge in the industry that is more accurate than the conventional fuel gauges such as that illustrated in FIG. 2.

FIG. 3 illustrates a system 300 that results in calculation of OCV according to some embodiments of the present invention. As illustrated in FIG. 3, engine 320 operates similarly to engine 216 and receives a capacitance from OCV/SOC table 332, the difference ($OCV_{OLD}-V_B$) calculated in summer 310, and the value of equivalent resistance $R_{eq}$. As is illustrated in FIG. 3, the value of $OCV_{OLD}$ in block 308 is the stored value of the output $OCV_{NEW}$ from engine 320, which is stored in block 308. The battery voltage $V_B$ is the sampled voltage of battery 302 from ADC 304. OCV/SOC table 332 receives data from battery characterization 330, which includes chemistry based data for battery 302 that relates the OCV to the capacitance C and the state-of-charge (SOC). As discussed above, the new value for OCV can be given by $$OCV_{new} = OCV_{old} + (V_B - OCV_{old}) * \left(1 - e^{\left(\frac{-t}{R_{eq}*C}\right)}\right),$$

In accordance with embodiments of the present invention, a current ADC 306 provides a digitization of the current from battery 302, resulting in a digitized indication of the battery current $I_B$. The battery current $I_B$ from current ADC 306 and the difference ($OCB-V_B$) are input to divider 314. Divider 314 calculates a resistance by calculating $R=(OCV-V_B)/I_B$. The value of R calculated by divider 314 is then multiplied by a value K in amplifier 316 to provide the value of equivalent resistance of battery 302 $R_{eq}$, $R_{eq}=K((OCV-V_B)/I_B)$. The value of $R_{eq}$ is stored in REQ block 318 and provided to engine 320.

The value of K used in amplifier 316 is adaptively adjusted. As is illustrated in FIG. 3, the battery current $I_B$ is integrated in block 312, which provides a coulomb counter, to provide the charge Q that has been drawn from battery 302. The value of Q is input to divider 322, which also receives a value for the full charge capacity of battery 302, $Q_F$, that is stored in FullCap 324. The value of $Q_F$ stored in FullCap 324 corresponds to the ideal discharge conditions (e.g., room temperature and C/24 load). In divider 322, the ratio of $Q/Q_F$ is computed. The ratio $Q/Q_F$ represents an absolute value of the state-of-charge of battery 302, $SOC_{abs}$. This value is compared with the value of SOC that is obtained from table lookup 332 to form an error, Error=SOC−$SOC_{abs}$, in adder 328. The error value ERROR is input to adaptive amplifier 326 where the new value of K is computed as K'=K−β*(Error), where K' is the adjusted value of the parameter K while K is the old value of K. Consequently, for every timing cycle where current and voltage data is taken from battery 302, the value of K is adjusted according to the loop gain parameter β.

When fuel gauge 300 is initialized, K is initialized to the same value of Design Capacity, which may be an arbitrary initial value that may be close to the ultimate adaptively chosen value. During each battery relax detection (i.e., each data analysis clock cycle), the value of ERROR (SOC−$SOC_{abs}$) is calculated. During every relax, K can be updated as: K'=K−Error*β, where β is the selected loop gain.

Fuel gauge 300 as illustrated in FIG. 3 can be implemented as a combination of microprocessors operating algorithms to perform the calculations described above along with circuitry for receiving and processing current and voltage data from battery 302. Appropriate filtering and analog signal processing techniques may be additionally added prior to implementation of ADCs 304 and 306. The value of SOC can be provided to a user through a user interface in order to indicate the charging state of battery 302. Display of the SOC can be implemented through depiction of a dial, bar graph, numerical number, or other fashion to indicate the charge of battery 302.

As is illustrated in FIG. 3, a feedback circuit is used to determine the ratio K between the battery current, battery voltage, and the resultant value of $R_{eq}$. The calculated OCV and SOC using this method is much more accurate across temperature, load, state-of-charge, and battery aging. The fuel gauge no longer uses temperature information to determine OCV and SOC. If the battery chemistry is well known in the OCV/SOC table used by block 332, even battery characterization can be eliminated. Since the value of AbsFullCap=ΔQ/ΔSOC, having a more accurate OCV and SOC determination will result in a more accurate tracking of the battery's full capacity.

Therefore, embodiments of the current invention determine the equivalent resistance $R_{eq}$ based on the measured current and voltage through the battery according to a multiplication factor K, which is dynamically updated based on the integrated current, SOC, and other factors. A fuel gauge according to some embodiments will provide an output OCV that is much more accurate than conventional methods across temperature changes, device-to-device variation, different SOC % levels, different battery currents, and battery aging levels.

The above detailed description is provided to illustrate specific embodiments of the present invention and is not intended to be limiting. Numerous variations and modifications within the scope of the present invention are possible. The present invention is set forth in the following claims.

What is claimed is:

1. A method of operating a fuel gauge, comprising:
   measuring, with a voltage analog-to-digital converter of the fuel gauge, a battery current through a battery;
   measuring, with a current analog-to-digital converter of the fuel gauge, a battery voltage across the battery;
   determining an equivalent resistance in an amplifier of the fuel gauge using a multiplier K and receiving resistance determined by the battery current and the battery voltage;
   determining, in an engine of the fuel gauge, an open circuit voltage based, in part, on the equivalent resistance;
   determining a state-of-charge in a table lookup of the fuel gauge based on the open circuit voltage; and
   adjusting the multiplier K in an adaptive loop based on the battery current and the state-of-charge, wherein adjusting the multiplier K includes
   integrating the battery current in an integrator of the adaptive loop to produce a charge Q;
   dividing the charge Q with a full-charge value to produce an absolute state-of-charge in a divider of the adaptive loop;
   producing an error value as a difference between the state-of-charge and the absolute state-of-charge in an error summer of the adaptive loop; and
   producing a new multiplier K according to the error value and a loop gain in a loop amplifier of the adaptive loop,
   wherein producing the new multiplier K comprises executing the following equation: K'=K−β*(error value), where K' is the new multiplier K, K is the old multiplier K, β is the loop gain, and error_value is the error value.

2. The method of claim 1, wherein determining the equivalent resistance includes
   calculating a resistance from the measured current and the measured voltage in a divider of the fuel gauge; and
   multiplying the resistance by the multiplier K in the amplifier of the fuel gauge.

3. The method of claim 1, wherein determining the open circuit voltage includes
   receiving the equivalent resistance into the engine;
   receiving a difference between a prior open circuit voltage and the battery voltage from a summer of the fuel gauge;
   receiving a capacitance from the table lookup based on the prior open circuit voltage; and
   calculating, in the engine, the open circuit voltage from the equivalent resistance, the difference, and the capacitance.

4. The method of claim 3, wherein the open circuit voltage $OCV_{new}$ is calculated from the following equation:

$$OCV_{new} = OCV_{old} + (V_B - OCV_{old}) * \left(1 - e^{\left(\frac{-t}{R_{eq}*C}\right)}\right)$$

where t is the time since calculation of the old open circuit voltage, $OCV_{old}$.

5. The method of claim 1, wherein determining a state of charge comprises looking up the state of charge in a look-up table based on battery characterization data and the open circuit voltage.

6. A fuel gauge, comprising:
a voltage analog-to-digital converter coupled to a battery and configured to provide a battery voltage;
a current analog-to-digital converter coupled to the battery and configured to provide a battery current;
a divider coupled to receive the battery voltage and the battery current and configured to produce a resistance;
a multiplier coupled to produce an equivalent resistance by multiplying the resistance by a multiplier value K;
an adaptive loop that produces the multiplier value K, wherein the adaptive loop includes
   an integrator configured to integrate the battery current to produce a charge Q,
   a divider coupled to receive the charge Q and to receive a full charge value, the divider configured to produce an absolute state-of-charge,
   a summer coupled to receive a state-of-charge from the table lookup and the absolute state-of-charge and produce an error as the state-of-charge minus the absolute state-of-charge, and
   an adaptive amplifier coupled to receive the error and produces the multiplier value K based on an old multiplier value K and the error,
   wherein the multiplier value K is given by $K'=K-\beta*(error)$ where $\beta$ is a loop gain,
where error is the difference between the state-of-charge and an absolute state-of-charge;
a table lookup coupled to provide a capacitance based on an open-circuit voltage;
a summer that takes a difference between the battery voltage and the open-circuit voltage; and
an engine that produces a new open-circuit voltage based on the open-circuit voltage, the capacitance, and the difference.

7. The fuel gauge of claim 6, wherein the table lookup receives data from a battery characterization which includes data relating open-circuit voltage, state-of-charge, and capacitance C for the battery.

8. A fuel gauge, comprising:
means for obtaining a battery voltage and a battery current from a battery;
means for producing an equivalent resistance based on the battery voltage, the battery current, and a multiplier K;
means for producing the multiplier K, wherein the means for producing the multiplier K includes
   means for producing a charge from the battery current,
   means for producing an absolute state-of-charge,
   means for obtaining a state-of-charge based on the prior open-circuit voltage,
   means for producing an error between the state-of-charge and the absolute state-of-charge, and
   means for producing the multiple K from the error and a loop gain where the multiplier value K is given by $K'=K-\beta*(error)$ where $\beta$ is a loop gain;
means for producing a capacitance based on a prior open-circuit voltage; and
means for producing a new open-circuit voltage based on the prior open-circuit voltage, the battery voltage, the capacitance, and the equivalent resistance.

\* \* \* \* \*